US012802945B2

(12) United States Patent
Ventzek et al.

(10) Patent No.: US 12,802,945 B2
(45) Date of Patent: Nov. 17, 2026

(54) METHOD AND APPARATUS FOR PLASMA PROCESSING

(71) Applicant: Tokyo Electron Limited, Tokyo (JP)

(72) Inventors: Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 614 days.

(21) Appl. No.: 18/189,519

(22) Filed: Mar. 24, 2023

(65) Prior Publication Data

US 2023/0230814 A1 Jul. 20, 2023

Related U.S. Application Data

(63) Continuation of application No. 16/221,918, filed on Dec. 17, 2018, now Pat. No. 11,688,586.

(Continued)

(51) Int. Cl.
*H01J 37/32* (2006.01)
*H10P 34/40* (2026.01)

(52) U.S. Cl.
CPC .. *H01J 37/32541* (2013.01); *H01J 37/32082* (2013.01); *H01J 37/32348* (2013.01); *H01J 37/3255* (2013.01); *H01J 37/32715* (2013.01); *H10P 34/40* (2026.01); *H01J 2237/063* (2013.01)

(58) Field of Classification Search
CPC ........... H01J 37/32541; H01J 37/32082; H01J 37/32348; H01J 37/3255; H01J 37/32715; H01J 2237/063; H01J 37/32422; H01L 21/263
See application file for complete search history.

(56) References Cited

U.S. PATENT DOCUMENTS

| | | | |
|---|---|---|---|
| 4,190,849 | A | 2/1980 | Powell |
| 6,072,147 | A | 6/2000 | Koshiishi et al. |

(Continued)

FOREIGN PATENT DOCUMENTS

| | | | |
|---|---|---|---|
| JP | 2014139889 | A | 7/2014 |
| JP | 2017520938 | A | 7/2017 |
| KR | 20080107150 | A | 12/2008 |

OTHER PUBLICATIONS

G. Carter, and J.S. Colligon, "Ion Bombardment of Solids," American Elsevier Publishing, Inc. (1968) 30-75.

(Continued)

*Primary Examiner* — Mounir S Amer
*Assistant Examiner* — Alexander Belousov
(74) *Attorney, Agent, or Firm* — Slater Matsil, LLP

(57) ABSTRACT

A method of processing includes directing an electron beam comprising ballistic electrons from an electron source towards a peripheral region of a substrate to be processed. The peripheral region surrounds a central region of the substrate. The electron beam may be directed such that the ballistic electrons impinge on the peripheral region and not on the central region of the substrate. The ballistic electrons may stimulate chemical reactions on the substrate. The method may include placing the substrate on a substrate holder disposed within a vacuum chamber. The method may also include generating the electron beam from a plasma in the vacuum chamber. The method may further include processing the substrate with ions from the plasma.

20 Claims, 16 Drawing Sheets

Related U.S. Application Data

(60) Provisional application No. 62/724,865, filed on Aug. 30, 2018.

(56) References Cited

U.S. PATENT DOCUMENTS

| | | | | |
|---|---|---|---|---|
| 9,290,848 | B2 | 3/2016 | Chen et al. | |
| 2008/0023440 | A1 | 1/2008 | Chen et al. | |
| 2008/0302482 | A1 | 12/2008 | Wang et al. | |
| 2009/0000942 | A1 | 1/2009 | Bai et al. | |
| 2009/0242135 | A1* | 10/2009 | Koshimizu | H01J 37/32091 156/345.48 |
| 2010/0006543 | A1 | 1/2010 | Sawada et al. | |
| 2011/0214813 | A1 | 9/2011 | Koshiishi et al. | |
| 2011/0309049 | A1 | 12/2011 | Papasouliotis et al. | |
| 2012/0258601 | A1 | 10/2012 | Holland et al. | |
| 2013/0098873 | A1 | 4/2013 | Ramaswamy et al. | |
| 2013/0119854 | A1 | 5/2013 | Lane et al. | |
| 2014/0320016 | A1* | 10/2014 | Chang | H01J 37/32541 315/111.41 |
| 2014/0339980 | A1 | 11/2014 | Wu et al. | |
| 2015/0376797 | A1 | 12/2015 | Chen et al. | |
| 2016/0189934 | A1* | 6/2016 | Nozawa | H01J 37/32715 156/345.51 |
| 2016/0293386 | A1 | 10/2016 | Chen et al. | |
| 2016/0293432 | A1* | 10/2016 | Ranjan | H01L 21/3065 |
| 2019/0272999 | A1* | 9/2019 | Cho | H01L 21/32136 |
| 2019/0355556 | A1 | 11/2019 | Takahashi | |

OTHER PUBLICATIONS

John H Keller, “Inductive plasmas for plasma processing,” Plasma Sources Sci. Technol. 5 (1996) 166--172.

John H Keller, “New and possible future trends in inductively coupled plasmas {ICPs) for semiconductor processing,” Plasma Phys. Control. Fusion 39 (1997) A437-A443.

K Niazi, A J Lichtenberg, MA Lieberman, and DL Flamm, “Operation of a helical resonator plasma source,” Plasma Sources Sci. Technol. 3 (1994) 482-495.

K. Denpoh and PL Ventzek, “Test particle simulation of the role of ballistic electrons in hybrid dc/rf capacitively coupled plasmas in argon,” JVSTA, 26, 1415 (2008); doi: 10.1116/1.2981064.

P.L. Ventzek and K. Denpoh, “Test particle simulation of the role of ballistic electrons in hybrid dc/rf capacitively coupled CF4 plasmas,” JVSTA, 27, 287 (2009); doi: 10.1116/1.3072922.

R BR Piejak, VA Godyak and BM Alexandrovich, “A simple analysis of an inductive RF discharge,” Plasma Sources Sci. Technol. 1 (1992) 179-186.

Tokyo Electron Limited, “Notification of Reexamination”, China National Intellectual Property Administration, Application No. 201980052000.7, issued Jul. 13, 2025, 13 pages.

China National Intellectual Property Administration, Application No. 201980052000.7, Oct. 31, 2024, 11 pages.

China National Intellectual Property Administration, Application No. 201980052000.7, Dec. 27, 2023, 9 pages.

Translated Korean Office Action, Applicant Code: 519990185062, Jun. 27, 2024, 10 pages.

* cited by examiner

| Biasing Configuration | Edge Electrode | Center Electrode | Substrate Holder |
|---|---|---|---|
| 1 | Pulsed DC A | HF | LF |
| 2 | Pulsed DC A | HF and Pulsed DC B | LF |
| 3 | Pulsed DC A | HF and Pulsed DC B | Pulsed LF |
| 4 | Pulsed DC A | Grounded | HF and LF |
| 5 | Pulsed DC A | Pulsed DC B | HF and LF |
| 6 | Pulsed DC A | Grounded | HF and Pulsed LF |
| 7 | Pulsed DC A | Pulsed DC B | HF and Pulsed LF |

FIG. 11B

METHOD AND APPARATUS FOR PLASMA PROCESSING

CROSS-REFERENCE TO RELATED APPLICATIONS

This application is a continuation of U.S. application Ser. No. 16/221,918, filed on Dec. 17, 2018, entitled "Method and Apparatus for Plasma Processing," and claims the benefit of U.S. Provisional Application No. 62/724,865, filed on Aug. 30, 2018, which applications are hereby incorporated herein by reference in their entirety.

TECHNICAL FIELD

The present invention relates generally to plasma processing, and, in particular embodiments, to a method and apparatus for plasma processing.

BACKGROUND

In recent decades plasma processing has found a variety of applications in a number of industries. For example, plasma processes are routinely used for deposition or removal of materials, including deposition or etching of thin layers employed in the fabrication of microelectronic circuits, flat-panel or other displays, solar cells, microelectromechanical systems, and the like.

The manufacture of semiconductor devices involves a series of techniques including formation, patterning, and removal of a number of layers of material on a substrate. In order to achieve the physical and electrical specifications of current and next generation semiconductor devices, processing flows enabling reduction of feature size while maintaining structural integrity are desirable for various patterning processes. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters nanometer-scale semiconductor device fabrication nodes.

As device structures densify and develop vertically, the desire for precision material processing becomes more compelling. Trade-offs between selectivity, profile control, film conformality, and uniformity in plasma processes can be difficult to manage. Thus, equipment and techniques that isolate, and control the process conditions that are optimal for etch and deposition regimes are desirable in order to precisely manipulate materials and meet advanced scaling challenges.

With each generation of semiconductor technology, not only have the materials have to be precisely manipulated, but also sufficient uniformity has to be maintained across the semiconductor wafer. In particular, features at the edges have to look and function similar to the features at the center of the wafer. If such variation across the wafer is excessive, the chips formed at the edges of the wafer have to be discarded thereby significantly reducing process yield.

Plasma processes are commonly used in the manufacture of semiconductor devices. For example, plasma etching and plasma deposition are common process steps during semiconductor device fabrication. Controlling across wafer variation during plasma processing is challenging due to the large wafer sizes, e.g., 300 mm, used in semiconductor manufacturing.

SUMMARY

In accordance with an embodiment of the present invention, a plasma processing system includes a vacuum chamber, a substrate holder configured to hold a substrate to be processed where the substrate holder is disposed in the vacuum chamber. The system further includes an electron source disposed above a peripheral region of the substrate holder, the electron source being configured to generate an electron beam towards the peripheral region of the substrate holder.

In accordance with an alternative embodiment of the present invention, a method of processing includes placing a substrate to be processed on a substrate holder disposed within a vacuum chamber, where the substrate includes a central region surrounded by a peripheral region. From an electron source, an electron beam including ballistic electrons is directed towards the peripheral region.

In accordance with an alternative embodiment of the present invention, an electron-generating apparatus of a plasma system includes an edge electrode portion disposed around a central portion. The edge electrode portion includes an inner diameter greater than the diameter of the central portion, a thickness less than the inner diameter, a first conductive region disposed between the inner diameter and an outer diameter, and a first electrical coupling component for coupling a direct-current (DC) power supply to the first conductive region. The edge electrode portion also includes an outer surface configured to be exposed to a plasma of the plasma system and configured to generate electrons.

BRIEF DESCRIPTION OF THE DRAWINGS

For a more complete understanding of the present invention, and the advantages thereof, reference is now made to the following descriptions taken in conjunction with the accompanying drawings, in which:

FIG. 11B is a table of some embodiments of biasing configurations for an edge electrode, a center electrode, and a substrate holder in a plasma processing apparatus;

Corresponding numerals and symbols in the different figures generally refer to corresponding parts unless otherwise indicated. The figures are drawn to clearly illustrate the relevant aspects of the embodiments and are not necessarily drawn to scale. Furthermore, the number, size, and positioning of gas conduits in various figures do not reflect the number, size, and positioning of gas conduits in practice and are mere intended to illustrate relevant concepts.

DETAILED DESCRIPTION OF ILLUSTRATIVE EMBODIMENTS

To improve manufacturing yield during plasma processing, embodiments of the present invention disclose a plasma processing tool and method in which electron beams are generated selectively in a peripheral region of an electrode assembly overlying a peripheral region of the wafer. The electrons beams may be concurrently or sequentially applied selectively during the plasma process so as to change the reactivity of the wafer surface in this peripheral region, which helps mitigate variations between devices in the central region of the wafer and the peripheral region of the wafer.

An embodiment plasma-processing apparatus will be described using FIGS. 1-3. An illustrative application of the process tool will be discussed using FIGS. 4A-4C. Embodiments of an upper electrode assembly that may be used in the plasma tool of FIG. 1 will be described using FIGS. 5-8, 10. Another embodiment plasma-processing apparatus will be described using FIG. 12. Embodiments of an upper electrode assembly that may be used in the plasma tool of FIG. 12 will be described using FIGS. 13-14. An embodiment with an electron source external to a primary plasma vacuum chamber will be described using FIG. 15.

Figure 1:
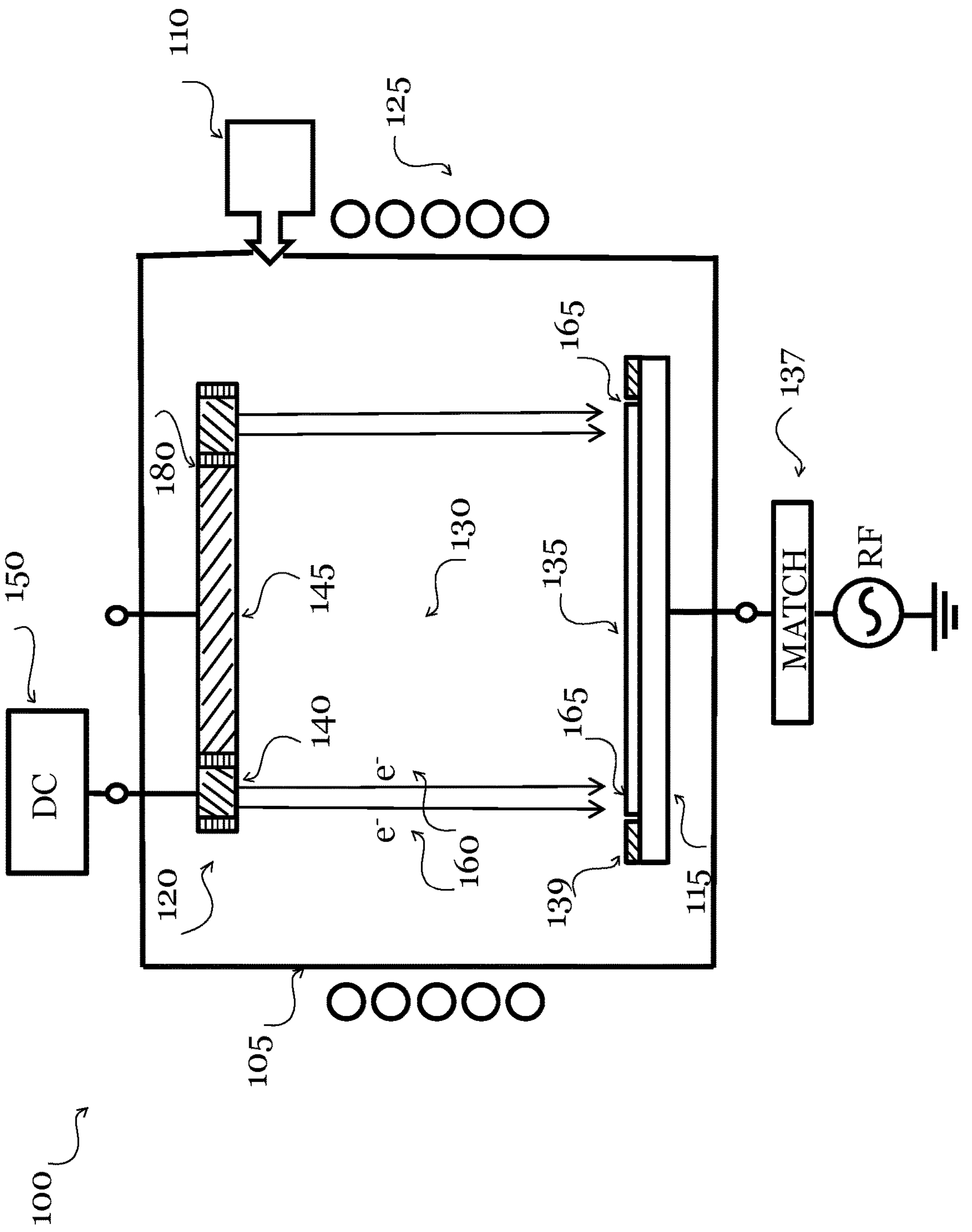
FIG. 1 is a schematic diagram of an embodiment of a plasma-processing apparatus comprising a DC-biased edge electrode.

FIG. 1 is a schematic diagram of an embodiment of a plasma-processing apparatus comprising a DC-biased edge electrode.

In this embodiment, a plasma processing apparatus 100 comprises a processing chamber 105 (e.g., a vacuum chamber), a gas input system no, a substrate holder 115, and an upper electrode assembly 120, and a coil 125. The gas input system 110 provides process gases into the processing chamber 105. The gas input system no may include multiple inputs and may input different gases into the processing chamber 105. In an embodiment, a radio-frequency (RF) bias is applied to the coil 125, generating an Inductively Coupled Plasma (ICP) in a region 130 of the processing chamber 105. In other embodiments, the plasma may be generated as a Capacitively Coupled Plasma (CCP), a microwave plasma, or a generated by other methods. A workpiece or substrate 135, e.g., a semiconductor wafer, may be placed on the substrate holder 115. In an embodiment, an RF bias may be applied to the substrate holder 115 and the substrate 135 through a matching network 137.

In addition, a focus ring 139 may be placed around the substrate 135. In some embodiments, the plasma process may be an etch process, such as a Reactive Ion Etch (RIE) process, an Atomic Layer Etch (ALE) process, or the like. In other embodiments, the plasma process may be a deposition process, such as a Plasma-Enhanced Physical Vapor Deposition (PVD) process, a Plasma-Enhanced Chemical Vapor Deposition (CVD) process, an Atomic Layer Deposition (ALD) process, or the like. In yet other embodiments, the plasma process may produce any physical or chemical modification of the substrate.

In an embodiment, the upper electrode assembly 120 comprises an edge electrode 140, and optionally, a center electrode 145. As described further, the edge electrode 140 may be an electron source for ballistic electrons. In embodiments wherein the substrate 135 is approximately circular in shape, the edge electrode 140 and the optional center electrode 145 may be annular and circular in shape, respectively. It is appreciated herein that since the substrate 135, the upper electrode assembly 120, and the edge and center electrodes 140 and 145 are of nonzero height, the term circular is intended to mean more precisely cylindrical, and the term annular is intended to mean more precisely in the shape of an annular cylinder.

A direct-current (DC) supply 150 provides a DC bias to the edge electrode 140. In various embodiments, the DC bias may be continuous or pulsed. In an embodiment, the DC bias supplied to the edge electrode 140 is negative with respect to a peripheral region, for example an extreme edge region 165, of the substrate 135, creating an electric field from the extreme edge region 165 to the edge electrode 140. Under the influence of this electric field, positively charged ions in the plasma are accelerated towards the edge electrode 140 and some collide with it. In some of these collisions, electrons are ejected from the edge electrode 140. Such electrons are referred to as secondary electrons, to distinguish them from plasma electrons arising from the ionization of gases. The ratio of the number of secondary electrons ejected from a surface to the number of positive ions colliding with it is the secondary electron emission coefficient. The secondary electron emission coefficient depends on a variety of factors. It is generally higher for oxide surfaces and lower for metal surfaces. For a silicon surface, a typical secondary electron emission coefficient may be approximately 0.1 (e.g., 0.027 for 100V ions in one illustration), indicating that for every ten ions colliding with a silicon electrode surface, one secondary electron may be generated.

Secondary electrons emanating from the edge electrode 140 are accelerated towards the extreme edge region 165 of the substrate 135 under the influence of the electric field and gain energy in the process, but may be scattered off course and also lose energy in collisions with various species present in the plasma. Ballistic electrons 160 suffer no collisions in the plasma and arrive at the extreme edge region 165 carrying the full energy imparted to them by the electric field. For example, if the electric potential difference between the edge electrode 140 and the extreme edge region 165 is 300V, ballistic electrons 160 may arrive at the substrate 135 carrying energies of approximately 300 eV.

Other, nearly ballistic, electrons may only undergo a small number of nearly elastic collisions, maintaining most of the energy, and arrive at the substrate with substantial energy sufficient to stimulate chemical reactions thereon. Still other electrons may suffer many collisions and carry little more than the energy corresponding to the average electron temperature in the plasma.

The magnitude of the DC bias applied from the DC power supply to the edge electrode 140 affects not only the energies, but also the number of electrons arriving at the extreme edge region 165. The electron energy required to stimulate chemical reactions at a surface depends on the surface and the chemical reactions desired. In many plasma processes of interest, energies on the order of a few hundred electron-volts may accelerate or decelerate the reaction rate at the surface, while in others energies on the order of dozens of electron-volts may be sufficient. The magnitude of the DC bias applied to the edge electrode may also have to be sufficient to ensure that a sufficient number of electrons arrive at the extreme edge region 165 with enough energy. In some embodiments, the DC bias applied to the edge electrode 140 is negative with respect to the minimum potential appearing on an extreme edge region 165 of the substrate 135, which may be somewhat different from the minimum potential appearing elsewhere on the substrate 135. When an RF bias is supplied to the substrate 135, the minimum potential occurs at the most negative point of the RF cycle. When an RF bias is supplied to the substrate 135 through a capacitance, a DC self-bias may also appear on the substrate 135 and contribute to the total substrate bias. This substrate self-bias depends on both system and operating parameters. In various embodiments, the DC bias applied to the edge electrode 140 is selected to be in the range from 50V to 1000V, and about 500 V to 1000 V in one embodiment. In some embodiments, the DC bias applied to the edge electrode 140 may be applied while the substrate RF bias is on. In other embodiments, the DC bias applied to the edge electrode 140 and the substrate RF bias may be applied alternately. In an illustration, the substrate RF bias may be turned off, a DC pulse may then be applied to the edge electrode 140, and the substrate RF bias turned on after the DC pulse, with the sequence repeating. Such embodiments are particularly advantageous when the substrate self-bias is large.

Although secondary electrons may be initially ejected from the edge electrode 140 at various angles, and electrons may change direction due to collisions in the plasma, the electric field is strongest along a direction perpendicular to the surface of the edge electrode 140 and is highly effective in steering many electrons in that direction. As a result, the application of a negative DC bias to the edge electrode generates a beam of ballistic and nearby ballistic electrons. To a good approximation, the secondary electron density is annular in cross section and reflects the dimensions of the edge electrode 140. These secondary electrons travel substantially in a path perpendicular to the edge electrode and impinge the peripheral regions of the substrate 135. Accordingly, ballistic and nearby ballistic electrons are delivered to the peripheral regions of the substrate 135 with a high level of spatial precision.

As illustrated in FIG. 1, the secondary electrons impinge on the extreme edge region 165 on the substrate 135. The edge electrode 140 is designed such that the beam of electrons arriving at a substrate covers to a good approximation the extreme edge region 165 of the substrate 135. In an embodiment, the upper electrode assembly 120 may be positioned in a plasma processing system centered with respect to a substrate, the inner radius and width of the edge electrode 140 may be approximately equal to the inner radius and width of the extreme edge region 165 of the substrate 135.

In another embodiment, the width of the edge electrode 140 may be larger than the width of the extreme edge region 165 of the substrate 135 so that the electron beam both covers and extends somewhat outside the substrate 135. Extension of the electron beam beyond the edge of the substrate 135 may be beneficial in at least two ways. During plasma operation, ions can penetrate a small clearance commonly present between the substrate 135 and the focus ring 139, but the interior of the clearance is often shaded from electrons. Positive charge can thus accumulate on the substrate holder 115 in the clearance. This charge in turns alters the electrical potential near the edge of the substrate 135, resulting in differences in the desired plasma process between the extreme edge 165 and the rest of the substrate 135. When the electron beam covers the clearance area, beam electrons neutralize and thus prevent build-up of positive charges there. In addition, extension of the electron beam beyond the edge of the substrate 135 reduces the impact of any misalignment in the placement of the substrate 135 with respect to the edge electrode 140.

In addition to generating secondary electrons, positive ions (not shown) impinging on the edge electrode 140 may also dislodge atoms of the electrode material, in a process known as sputtering. These atoms may then enter the plasma and arrive at the substrate 135. If the edge electrode 140 and the optional center electrode 145 are directly exposed to the plasma, they may be made of materials selected specifically such that they are not detrimental to the intended plasma process. Alternatively, edge electrode 140 and the optional center electrode 145 may be clad in a protective layer made of a material that is not detrimental to the intended plasma process. Embodiments and other characteristics of the upper electrode assembly 120 are discussed further below.

In some embodiments, the beam of electrons may be directed onto the substrate 135 at the same time that the surface of the substrate 135 is exposed to the ions from the plasma. In this case, the beam electrons are present at the extreme edge region 165 while the ions interact with the surface of the substrate 135. Alternatively, in some embodiments, the beam of electrons may be directed onto the extreme edge region 165 and then followed by the ion flux so that the surface of the substrate 135 receives the electrons at a different time than which the ions are received.

Figure 2:
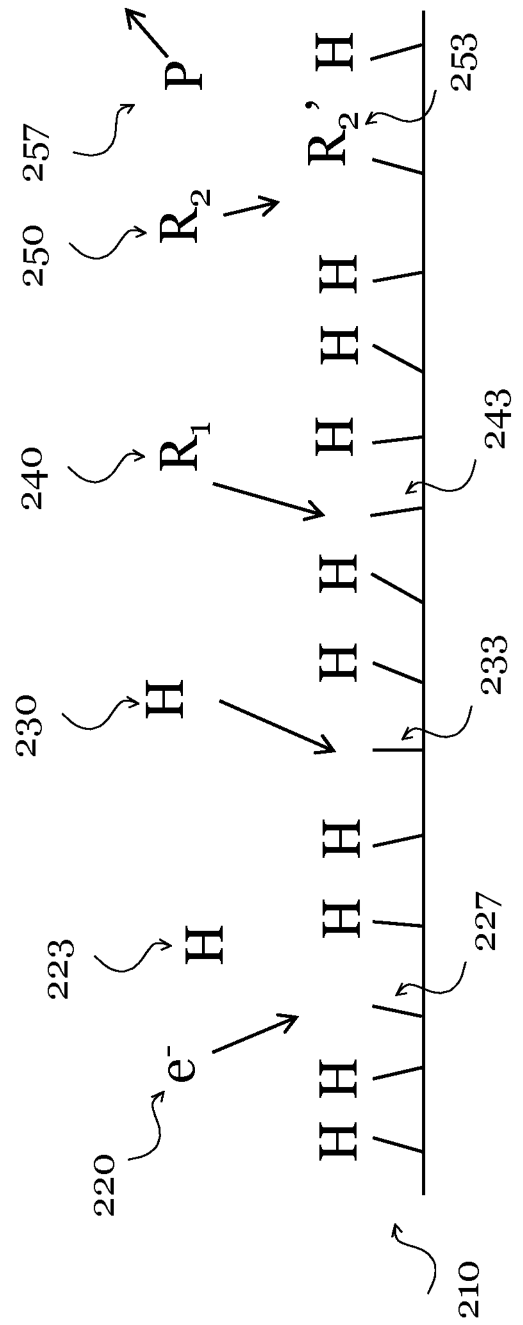
FIG. 2 is an illustration of exemplary electron-stimulated chemical reactions at a surface.
Figure 3:
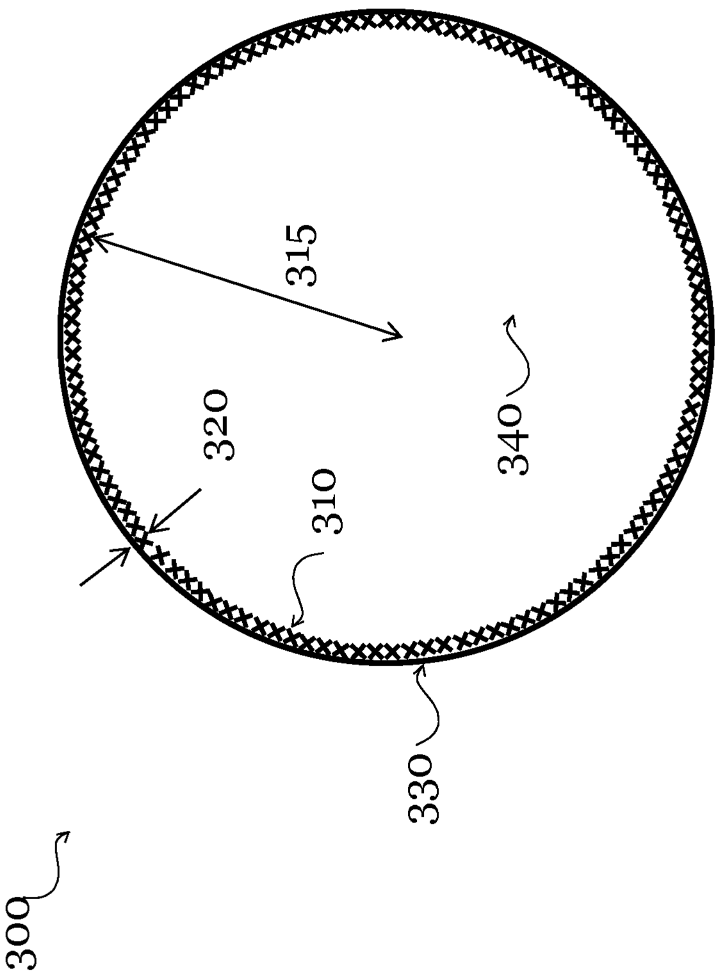
FIG. 3 is an illustration of an exemplary extreme edge region on a semiconductor wafer.

FIG. 2 is an illustration of exemplary electron-stimulated chemical reactions at a surface. A surface 210 may be any surface of any material, including top surfaces or sidewalls of materials such as silicon, silicon oxide, silicon nitride, silicon carbide, photoresist, Bottom Anti-Reflection Coating (BARC), various planarizing materials, hard masks, or the like. In particular, the surface 210 may be a surface of any layer used as an etch mask during a plasma etch process. Although the surface 210 is shown hydrogen-terminated in the FIG. 2, it may more generally be fully or partially terminated by one or more other atoms or atomic groupings, such as the hydroxyl group, halogen atoms, amine groups, fluorocarbon groups, or the like.

If an electron 220 impinges upon the surface 210 with sufficient energy, it may break a bond at the surface, thereby desorbing a species previously bonded to the surface and leaving a dangling bond. For example, the electron 220 can stimulate desorption of a hydrogen atom 223 and create a first dangling bond 227.

Dangling bonds thus created may participate in subsequent reactions. For example, a hydrogen atom 230 may arrive at the site of a second dangling bond 233 and adsorb on the surface by forming a bond with an atom of the underlying material, thus terminating the second dangling bond 233. Likewise, a reactant $R_1$ 240 may adsorb on the surface thus terminating a third dangling bond 243. In another event, the interaction of a reactant $R_2$ 250 with a dangling bond may results in two species, a reactant $R_2'$ 253 adsorbed on the surface and a reaction byproduct P 257 leaving the surface. In some plasma processes, the reactants $R_1$ and $R_2$ may be fluorocarbons.

Changes in the surface density of dangling bonds or in the species covering the surface may affect different plasma processes such as etching or deposition. For example, dangling bonds may promote deposition. Likewise, coverage of a silicon surface by fluorocarbons may protect it from plasma ions, rendering it relatively more resistant to etching than a hydrogen-terminated surface. Notably, the arrival of additional electrons may create additional dangling bonds on the adsorbed reactants, leading to continued growth of material on the surface 210. For example, if the reactant $R_1$ 240 or the reactant $R_2$ 250 are fluorocarbons, a fluorocarbon coating may continue to grow on the surface 210.

In an embodiment, the extreme edge region 165 of the substrate 135, referred to in FIG. 1, includes 10 percent or less, and in another embodiment includes 2 percent or less, of the width of the substrate 135, and in another embodiment includes an outer edge of the substrate 135.

The substrate 135 may be a circular semiconductor wafer in one embodiment. FIG. 3 is an illustration of an exemplary extreme edge region on a semiconductor wafer. On a wafer 300, an extreme edge region 310 may be approximately annular in shape. Just as the semiconductor wafer 300 is an example of the substrate 135, the extreme edge region 310 of the semiconductor wafer 300 is an example of the extreme edge region 165 of the substrate 135. In various embodiments, a ratio of an inner radius 315 of the extreme edge region 310 to a width 320 of the extreme edge region 310 for a semiconductor wafer may be between 10:1 to 150:1, and in an illustration, between 40:1 to 150:1.

In an illustration the extreme edge region 310 includes an outer edge 330 of the wafer 300. In some embodiments, the extreme edge region includes an annular region extending inward from the outer edge 330 by a width 320 that is 10 percent or less and preferably two percent or less of the radius of the substrate 135. For example, for a wafer with a 300-millimeter diameter, the extreme edge region includes an annular region extending inward from the outer edge 330 by a width 320 of 15 millimeters or less, and preferably 3 millimeters or less. It is contemplated herein that in some applications, the extreme edge region 310 may not reach the outer edge 330 and may instead lie entirely within the circle defined by the outer edge 330. It is also recognized herein that if a substrate is not circular, the extreme edge region may not be annular in shape. At least one aspect of the effect of the plasma process in the extreme edge region 165 of the substrate 135 may be different from the same aspect in an interior portion 340 of the wafer. For example, the plasma process may be a deposition process and an aspect of the effect of the plasma process may be the rate of growth on the top surface or sidewall of a given type of feature. The plasma process may be an etch process intended to form line features by etching around them and an aspect of the effect of the plasma process may be width of the line features. Or the plasma process may be a etch process intended to etch approximately cylindrical holes in a layer on a substrate and an aspect of the effect of the plasma process may be the diameter of the holes.

Figure 4A:
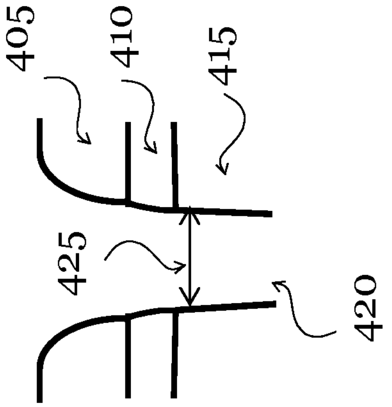
FIG. 4A is an exemplary illustration of etching of holes in a central portion of a semiconductor wafer.

FIG. 4A is an exemplary illustration of etching of holes in a central portion of a semiconductor wafer. A patterned layer of a photoresist 405 has been formed on a hard mask 410, which lies in turn on an oxide layer 415. The hard mask 410 may be silicon, silicon nitride, silicon carbide, or the like. A two-step etch process is commonly employed in such a scenario. In a first step, an etch process is used to etch openings in the hard mask 410, using the photoresist 405 as an etch mask. In a second step, a second etch process is used to etch holes in the oxide layer 415 using the hard mask 410 and any remaining photoresist 405 as etch masks. Exposed surfaces of the photoresist 405, the hard mask 410, or both, may be eroded during either or both plasma steps, as they too are etched to some extent. An aspect of the effect of the plasma process is a diameter 425 of the holes etched in the oxide layer, measured, for example, at the top. The diameter 425 is determined in part by this erosion.

Figure 4B:
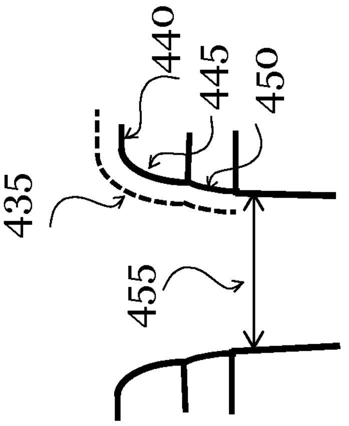
FIG. 4B is an exemplary illustration of etching of holes in an extreme edge region of a semiconductor wafer.

FIG. 4B is an exemplary illustration of etching of holes in an extreme edge region of a semiconductor wafer. In this example, a top surface 440 and a sidewall 445 of the photoresist 405, as well as a sidewall 450 of the hard mask 420, exhibit greater erosion compared to a relative position 435 common in the interior region of the wafer. Accordingly, a diameter 455 of a hole in the extreme edge region is larger than the diameter 425 in the interior region of the wafer. The difference in the level of erosion in the extreme edge region compared to the interior region may arise from a variety of factors, including differences in the electrical potential of the wafer and the focus ring, differences in the temperature of the wafer, or energies or densities of various plasma species near the wafer edge. Differences in such densities may occur, for example, due to loading effects arising from the sudden termination of on-wafer features at the edge. Effects arising from differences in the electrical potential of the wafer and the focus ring may be mitigated through judicious design and operation of the focus ring. Due to diffusion of plasma species and thermal diffusion, however, effects related to temperature and chemical factors are difficult to influence with fine spatial resolution. It is also recognized herein that there may be differences in the initial thickness or sidewall profile of the photoresist 405 arising from earlier process steps.

Figure 4C:
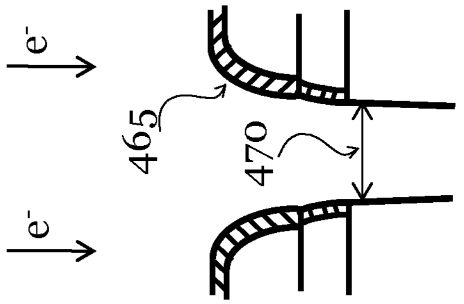
FIG. 4C is an exemplary illustration of etching of holes in an extreme edge portion of a semiconductor wafer in the presence of an electron beam.

FIG. 4C is an exemplary illustration of etching of holes in an extreme edge portion of a semiconductor wafer in the presence of an electron beam. Two competing processes, erosion of the photoresist 405 and hard mask 410 through etching on one hand, and electron-stimulated growth of reactants on the surface of the photoresist 405 and hard mask 410 on the other, may take place. For example, growth may begin following an initial period of erosion. An advantageous position 465 of the surfaces of the photoresist and hard mark may be reached and thereafter maintained in equilibrium between the two competing processes.

Accordingly, an outer hole diameter 470 that is smaller than the previously described hole diameter 455 and thus closer to the interior hole diameter 425 may be achieved in the extreme edge region of the wafer with the use of an electron beam. It is appreciated herein that although beam electrons may reach the interior surfaces of the hole being etched, their impact on inhibiting the etching of the hole is limited by the relative unavailability of fluorocarbon reactants inside the hole due to the shadowing effect of the sidewalls.

Figure 5:
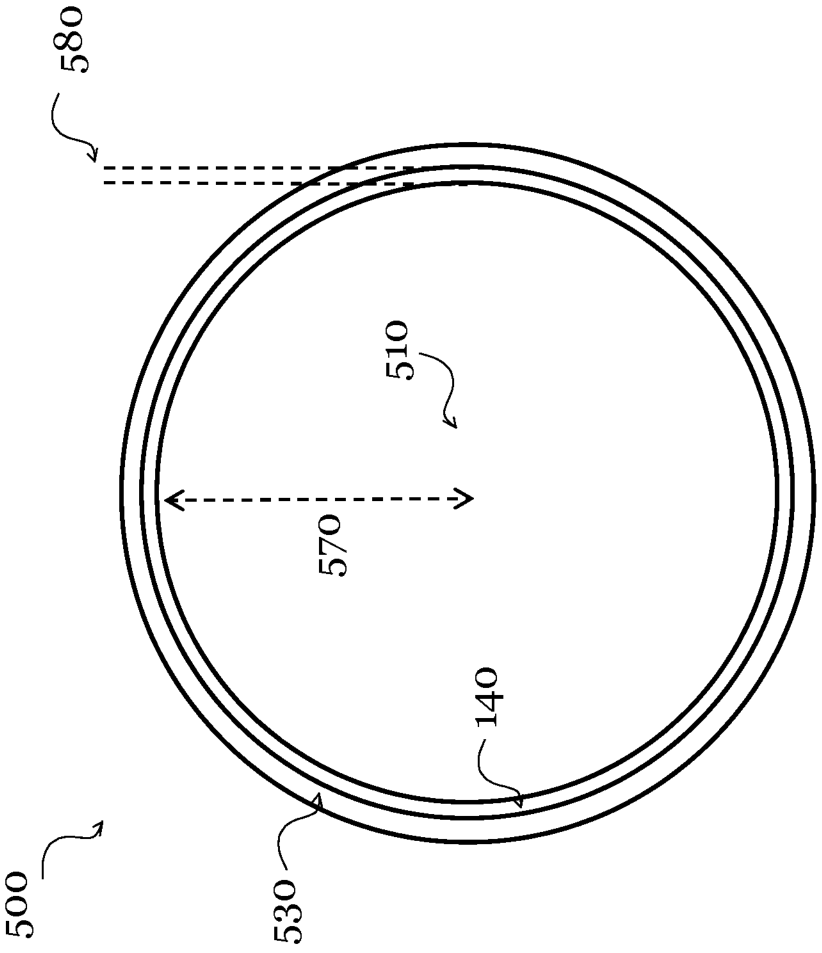
FIG. 5 is a plan view illustration of an embodiment of a upper electrode assembly comprising an edge electrode.

FIG. 5 is a plan view illustration of an embodiment of an upper electrode assembly comprising an edge electrode. In an embodiment, an upper electrode assembly 500 comprises a dielectric center piece 510, an edge electrode 140, and an outer insulator 530. The center piece 510 may be approximately cylindrical in shape and its thickness may be smaller than its diameter. The edge electrode 140 and the outer insulator 530 may be approximately annular cylinders in shape. In various embodiments, the edge electrode 140 may be made of a conducting material not detrimental to the intended plasma process. For example, for a silicon oxide etch process, the edge electrode 140 may be made of silicon or silicon carbide. In various embodiments, the center piece 510 and the outer insulator 530 may be made of one or more insulating materials, including ceramics such as yttria. An inner radius 570 and a width 580 of the edge electrode 140 may be approximately equal to the inner radius 315 and the width 320 of an extreme edge region 310 of a semiconductor wafer (e.g., discussed above). Accordingly, in various embodiments, a ratio of an inner radius 570 of the edge electrode 140 to a width 580 of the edge electrode 140 may be between 10:1 to 150:1. In other embodiments, the width 580 may be larger than the width 320 of an extreme edge region 310 of a semiconductor wafer.

The edge electrode 140 may be supplied with a continuous or pulsed DC bias. In an exemplary application of an etch process, the process may remove one monolayer of the material intended to be etched in approximately 100 milliseconds, and the number of surface sites on a surface of an etch mask may be of the order of magnitude of $10^{15}$ sites per centimeter squared. For example, the total number of lattice surface sites on a silicon (100) surface is about $1.3\times10^{15}$ $cm^{-2}$. To influence chemical processes on the surface of an etch mask in such an etch process advantageously, various embodiments may provide an electron flux between $10^{14}$ and $10^{16}$ electrons per centimeter squared per 100 milliseconds. For illustration, the electron flux can be selected so as to maintain a supersaturation of electrons relative to the instantaneous concentration of the reactants or dangling bonds on the surface, which can itself be lower than the total number of bond sites.

For embodiments wherein the DC bias applied to the edge electrode 140 is continuous, commonly available continuous DC power supplies are well capable for providing the necessary currents.

In some embodiments, the continuous DC bias may be applied only when and for the duration of time needed to stimulate growth on etch-mask surfaces. Commonly available pulsed DC power supplies operating in the kilohertz frequency range provide thousands of pulses per second. For embodiments wherein the DC bias applied to the edge electrode 140 is pulsed, current levels required to provide beam fluxes between $10^{14}$ and $10^{16}$ electrons per centimeter squared per 100 milliseconds are well within the capabilities of such power supplies. In an embodiment, the pulse width is selected to be long enough to ensure that the desired beam flux is supplied. In some embodiments, DC pulses may be applied only when needed to stimulate growth on etch mask surfaces.

Figure 6:
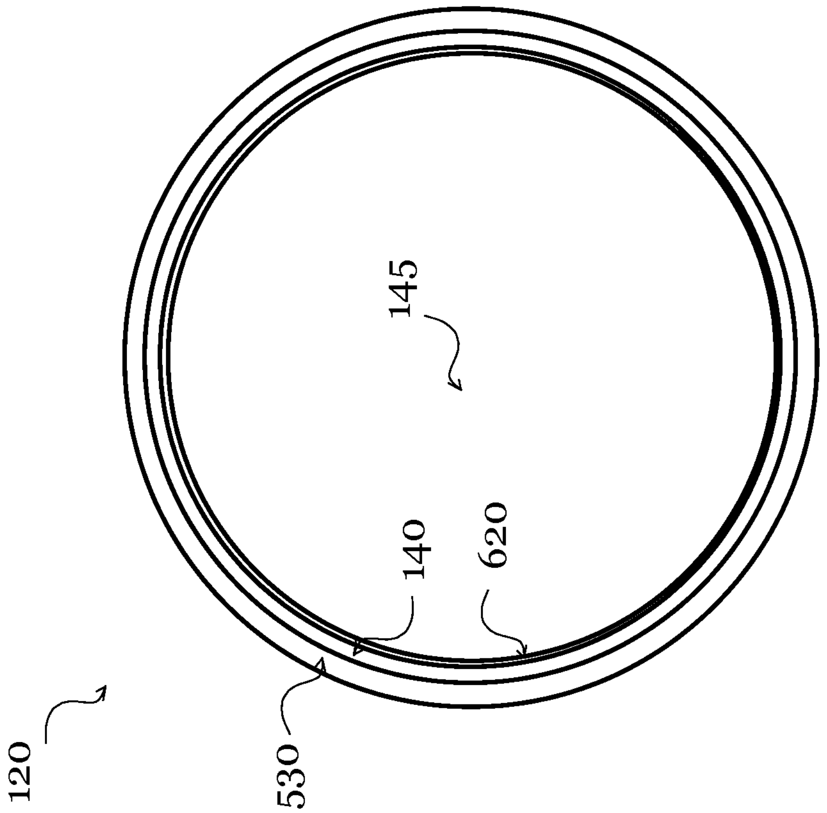
FIG. 6 is a plan view illustration of an alternative embodiment of a upper electrode assembly comprising edge and center electrodes.

FIG. 6 is a plan view illustration of an embodiment of an upper electrode assembly comprising edge and center electrodes. Unlike the embodiment of FIG. 5, in this embodiment, the upper electrode assembly includes an additional central electrode.

Accordingly, in this embodiment, an upper electrode assembly 120 comprises a center electrode 145, an inner insulator 620, an edge electrode 140, and an outer insulator 530. The center electrode 145 may be approximately cylindrical in shape and its thickness may be smaller than its diameter. The inner insulator 620, the edge electrode 140, and the outer insulator 530 may be approximately annular cylinders in shape. In an embodiment, the center electrode 145 may be made of doped silicon. The inner insulator 620 may be made of a variety of insulating materials, including ceramics such as yttria.

In various embodiments, the center electrode 610 may be supplied with a different bias voltage than the edge electrode 140. Various embodiments of the biasing of the center electrode 145 and the edge electrode 140 will be discussed further below.

Figure 7:
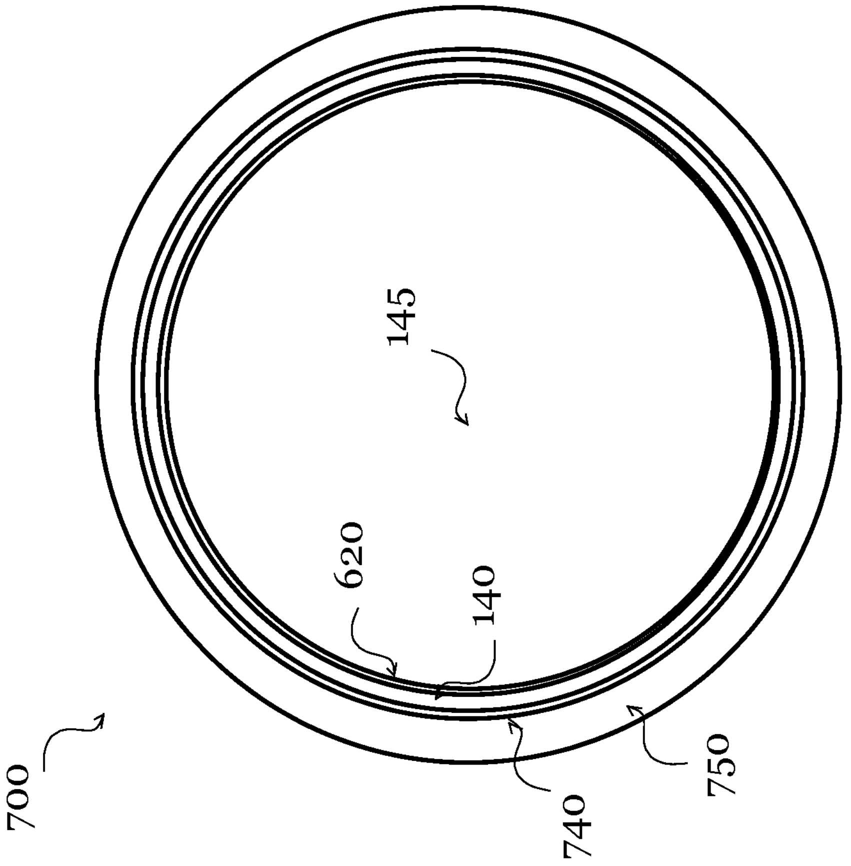
FIG. 7 is a plan view illustration of another embodiment of an upper electrode assembly comprising edge and center electrodes.

FIG. 7 is a plan view illustration of another embodiment of an upper electrode assembly comprising edge and center electrodes. In addition to the central electrode described in FIG. 6, this embodiment further includes an outer piece surrounding the edge electrode. In this embodiment, an upper electrode assembly 700 comprises a center electrode 145, an inner insulator 620, an edge electrode 140, an outer insulator 740, and an outer piece 750. The outer insulator 740 and the outer piece 750 may be approximately annular cylinders in shape. The outer insulator 740 provides electrical insulation between edge electrode 140 and the outer piece 750, and may be made of one or more insulating materials such as ceramics or the like, and may differ from the outer insulator 530 in width. The outer piece 750 may be made of insulating or conducting materials.

In embodiments wherein the outer piece 750 is conducting, it may be grounded, or DC- or RF-biased in continuous or pulsed mode. In such embodiments, an additional insulating ring (not shown) may surround the outer piece 750.

In the embodiments of FIGS. 5-7, electrodes of the upper electrode assembly are exposed to the plasma. As a result, electrode material may be sputtered into the plasma, and possibly arrive at the substrate and interfere with the plasma process thereon. For example, in embodiments where electrodes are made of doped silicon, sputtering of silicon may compete with and reduce the efficiency of a silicon etch process. For such applications, protected mask embodiments may be employed. In a protected mask embodiment, electrodes may be protected from the plasma by a cover or laminating material. Since the cover material may be sputtered during operation, it is selected such that it is not detrimental to the etch process. Depending on the etch process, the cover material may be a dielectric, such as a ceramic including yttria, an oxide, a nitride, the like, or composites or combinations thereof.

Figure 8:
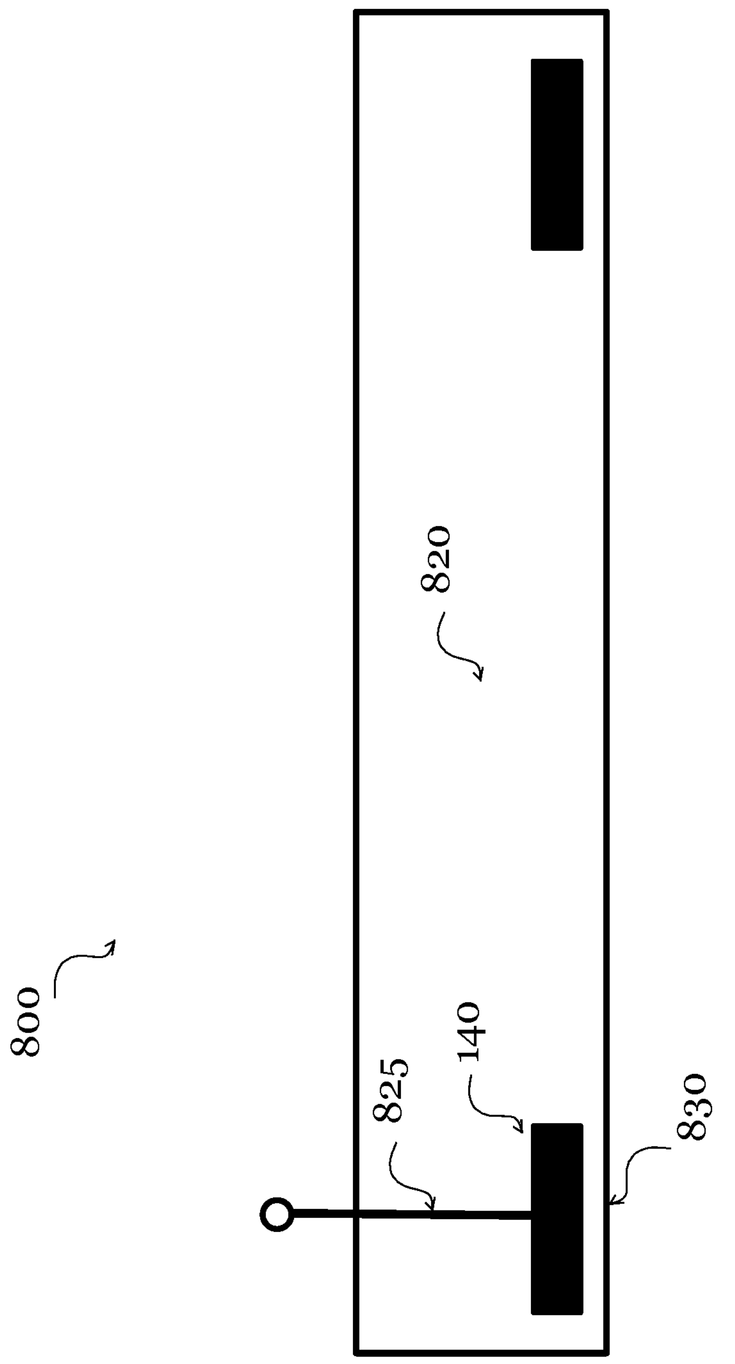
FIG. 8 is a schematic elevation-view cross section of an embodiment of a masked upper electrode assembly where an edge electrode is protected by a mask.

FIG. 8 is a schematic elevation-view cross section of an embodiment of a masked upper electrode assembly 800 where an edge electrode is protected by a mask. In this embodiment, an edge electrode 140 is disposed in a protective dielectric 820. The edge electrode 140 is made of conducting materials, such as doped silicon, metals or alloys, or combinations thereof, and is approximately an annular cylinder in shape. The height of edge electrode is commonly smaller than its diameter. The protective dielectric may comprise one or more pieces of one or more insulating materials, including ceramics such as yttria. In various embodiments, the edge electrode 140 may be printed into one or more pieces of the protective dielectric 820, or the edge electrode 140 and the protective dielectric 820 may be assembled from individual pieces. The edge electrode 140 is provided with an edge contact 825 for electrical access to allow biasing.

A surface region 830 of the protective dielectric 820 faces the plasma, covers the edge electrode 140, and is approximately annular in shape. When a negative DC bias is applied to the edge electrode, positive ions in the plasma are attracted towards the edge electrode 140, impinge on the surface region 830, and generate secondary electrons from the surface region 830. However, since the dielectric is not conducting, charges gradually collect on the surface region 830 until generation of secondary electrons and therefore the resulting electron beam is extinguished.

Figure 9:
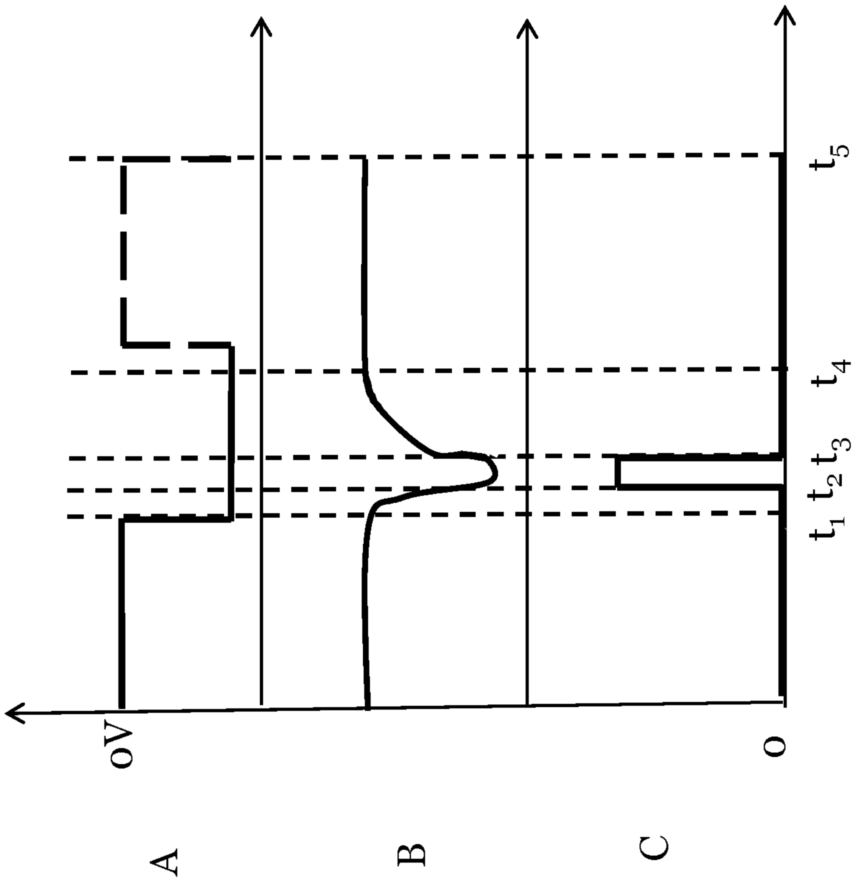
FIG. 9 illustrates exemplary dynamics of an electron beam for a dielectric-protected edge electrode.

FIG. 9 illustrates exemplary dynamics of an electron beam for a dielectric-protected edge electrode. Traces A, B, and C depict the bias applied to the edge electrode, the voltage at the surface of the dielectric, and the flux of electrons in the electron beam, respectively. A negative DC bias is applied to the edge electrode 140 at time t1. The voltage at the surface region 830 drops quickly from its value in the absence of the applied bias, in some processes, to a small negative value around 10V, towards a value approximately equal to the applied bias. An appreciable electron beam flux results at time $t_2$. As charges collect on the surface region 830, the surface voltage rises slowly back towards its original value. At time $t_3$, the surface voltage is no longer sufficient to generate a significant electron beam flux and by time $t_4$, it has nearly recovered to its original value. To affect the plasma process on the substrate on a continuing basis, it is advantageous to remove the DC bias, allowing charges accumulated on the surface region 830 to dissipate into the plasma, and reapplying the DC bias at a time $t_5$. It is therefore advantageous to use a pulsed DC supply to bias the edge electrode 140 in the masked upper electrode assembly 800.

Figure 10:
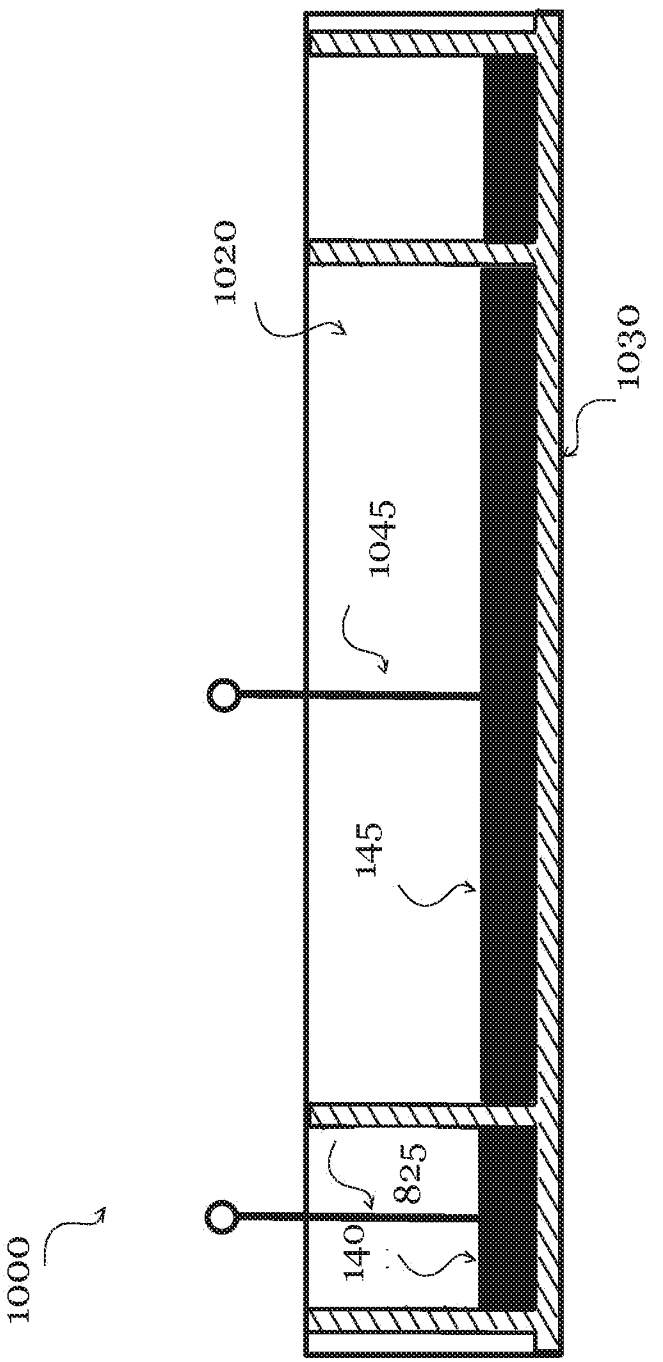
FIG. 10 is a schematic elevation-view cross section of an embodiment of a protected upper electrode assembly comprising an edge electrode and a center electrode.

FIG. 10 is a schematic elevation-view cross section of an embodiment of a protected upper electrode assembly comprising an edge electrode and a center electrode. In this embodiment, an edge electrode 140 and a center electrode 145 are disposed in an insulating body 1020. In addition, a protective dielectric 1030 is used to insulate the edge electrode 140 and the center electrode 145, and to protect them from the plasma.

In an embodiment, the protective dielectric 1030 may be yttria. Yttria is commonly used as a coating in plasma systems and generally does not result in signification contamination. In other embodiments, the protective dielectric 1030 may comprise one or more pieces of one or more other insulating materials, including other ceramics. The edge and center electrodes 140 and 145 are made of conducting materials, such as doped silicon, metals or alloys, or combinations thereof. In various embodiments, the edge and center electrodes 140 and 145 may be printed into one or more pieces of the body 1020 or the protective dielectric 1030, or they may be assembled from individual pieces. The edge and center electrodes 140 and 145 are provided with edge contact 825 and center contact 1045 for electrical access to allow independent biasing.

Figure 11A:
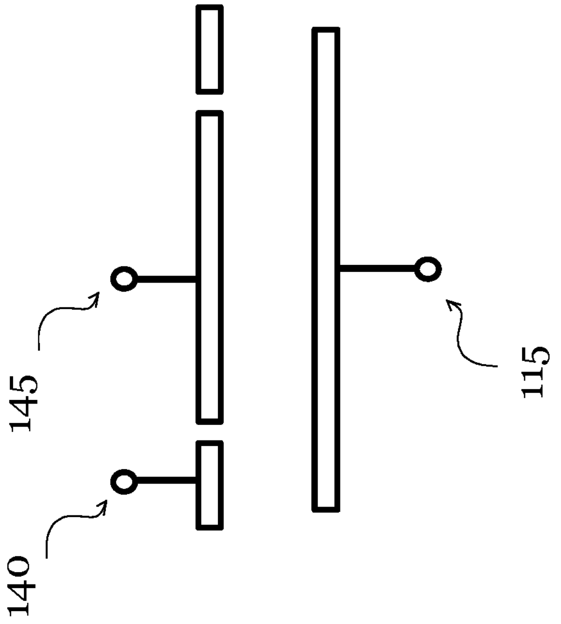
FIG. 11A is a schematic illustration of independent biasing of an edge electrode, a center electrode, and a substrate holder in a plasma processing apparatus.

FIG. 11A a schematic illustration of independent biasing of an edge electrode 140, a center electrode 145, and a substrate holder 115 in a plasma processing apparatus, while FIG. 11B is a table of some embodiments of biasing configurations for same. Pulsed DC bias A applied to the edge electrode 140 and pulsed DC bias B applied to the center electrode 145 may differ in voltage, pulse width, pulse frequency, pulse timing, or combinations thereof. In some embodiments, pulsed DC bias A may be larger in magnitude than pulsed DC bias B, resulting in a larger electron flux arriving at an extreme edge region than the interior portion of a substrate. In other embodiments, pulsed DC bias B may be larger in magnitude than pulsed DC bias A, resulting in a larger electron flux arriving in the interior portion than the extreme edge region of a substrate. The latter embodiments are advantageous where electrons are needed to stimulate chemical reactions preferentially in the interior portion, rather than in the extreme edge region. In yet other embodiments, pulses of the pulsed DC bias A may be alternated with pulses of the pulsed DC bias B, exposing the extreme edge and interior portions of the substrate to electrons alternately.

The HF (High-Frequency) and LF (Low-frequency) biases noted in rows 1-3 of FIG. 11B refer to biases commonly used in plasma systems for upper electrodes and substrate holders, respectively. The LF frequency is commonly below 30 KHz, but in some applications 400 kHz or 800 kHz, while the HF bias is commonly in the frequency range between 3 and 300 MHz, with 13, 27, 40, 60, 100, 120, and 200 MHz among commonly employed frequencies. Configurations listed in rows 4-7 are related to those in 1-3 in that HF bias is applied to the substrate holder instead of the center electrode.

Other biasing configurations are also possible. For example, the HF bias applied to the center electrode 145 in configurations 1-3 may also be applied to the edge electrode 140, in addition to the pulsed DC bias A. In other configurations, the substrate 115 may be grounded, while RF bias is applied to the center electrode 145, and optionally the edge electrode 140. Furthermore, various biases may be applied through matching networks or capacitances and coils may be present to further sustain the plasma.

It is recognized herein that in some embodiments of plasma processing systems, an inductively-coupled plasma may be sustained by a planar coil. In such embodiments, a faraday cage may be used to permit DC biasing of a dedicated electrode and thus the generation of an electron beam directed at an extreme edge region of a wafer.

Figure 12:
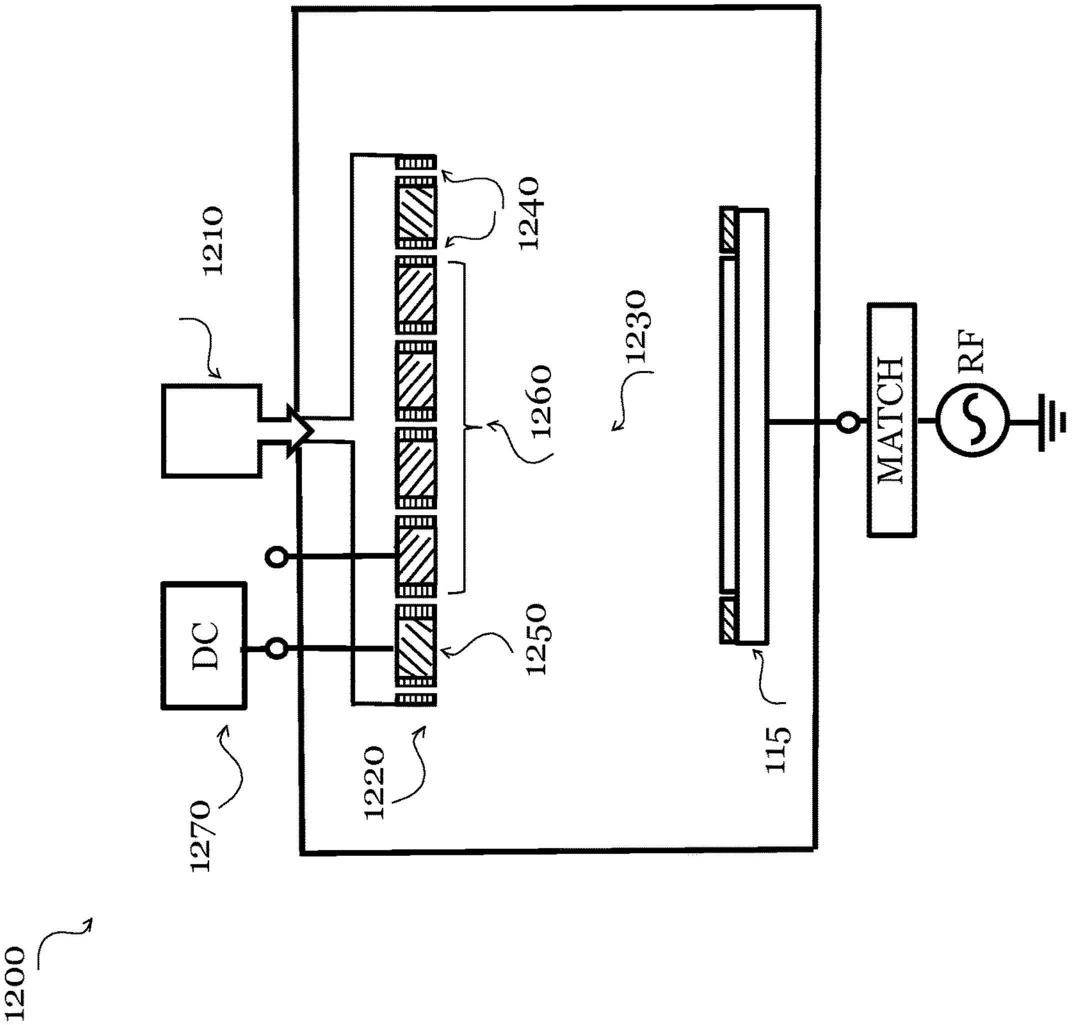
FIG. 12 is a schematic diagram of an embodiment of a plasma-processing apparatus with gas supply through an upper electrode assembly and comprising a DC-biased edge electrode.

In some plasma systems, it is customary to supply process gases through an upper electrode assembly. FIG. 12 is a schematic diagram of an embodiment of a plasma-processing apparatus with gas supply through an upper electrode assembly and comprising a DC-biased edge electrode. In this embodiment, a plasma processing apparatus 1200 comprises a gas input system 1210, a substrate holder 115, and an upper electrode assembly 1220. Process gases are introduced into a plasma region 1230 through gas conduits 1240 in the upper electrode assembly 1220. In an embodiment, the upper electrode assembly comprises an edge electrode 1250, and optionally, a center electrode 1260. In addition, a DC supply 1270 provides a DC bias to the edge electrode 1250. Depending on the placement of gas conduits 1240 in any embodiment of the upper electrode assembly 1220, the edge electrode 1250 may be similar to the edge electrode 140.

Figure 13:
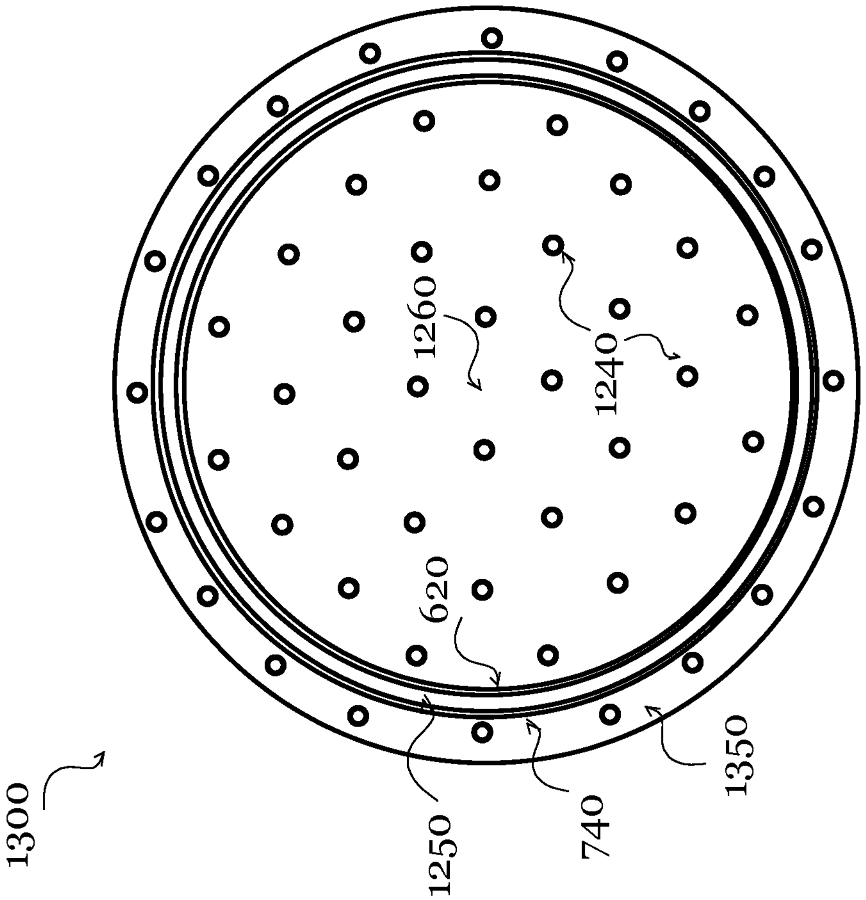
FIG. 13 is a plan view illustration of an embodiment of an upper electrode assembly comprising edge and center electrodes and conduits for gas supply.

FIG. 13 is a plan view illustration of an embodiment of an upper electrode assembly comprising edge and center electrodes and conduits for gas supply. In this embodiment, a masked upper electrode assembly 1300 comprises a center electrode 1260, an inner insulator 620, an edge electrode 1250, an outer insulator 740, and an outer piece 1350. In this embodiment, the center electrode 1260 and the outer piece 1350 may be similar in material, form, and operation to the center electrode 145 and the outer piece 750 of FIG. 7, with the exception that gas conduits 1240 are disposed in the center electrode 1260 and the outer piece 1350 to allow passage of gas.

Figure 14:
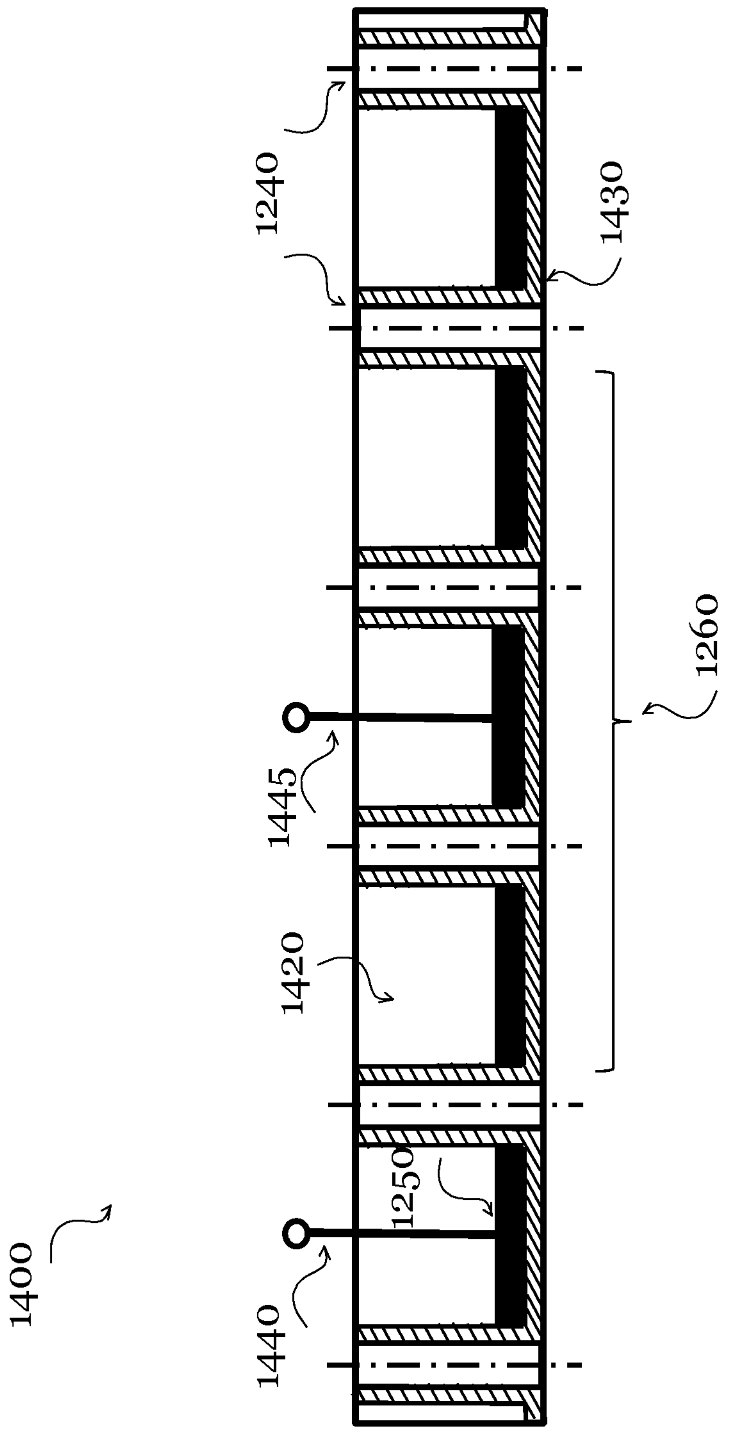
FIG. 14 is a schematic elevation-view cross section of an embodiment of a protected upper electrode assembly comprising edge and center electrodes and conduits for gas supply.

FIG. 14 is a schematic elevation-view cross section of an embodiment of protected upper electrode assembly 1400 comprising edge and center electrodes and conduits for gas supply. In this embodiment, an edge electrode 1250 and a center electrode 1260 are disposed in an insulating body 1420. In addition, a protective dielectric 1430 is used to insulate the edge electrode 1250 and the center electrode 1260, and to protect them from the plasma.

In an embodiment, the protective dielectric 1430 may be yttria. In other embodiments, the protective dielectric 1430 may comprise one or more pieces of one or more other insulating materials, including other ceramics. The edge and center electrodes 1250 and 1260 are made of conducting materials, such as doped silicon, metals or alloys, or combinations thereof. In various embodiments, the edge and center electrodes 1250 and 1260 may be printed into one or more pieces of the body 1420 or the protective dielectric 1430, or they may be assembled from individual pieces.

The edge electrode 1250 and the center electrode 1260 are provided with an edge contact 1440 and a center contact 1445 for electrical access, respectively, to allow biasing. Gas conduits 1240 are disposed in the protected upper electrode assembly 1400 to allow passage of gas.

As mentioned before, it is contemplated herein that in various embodiments, DC biases applied to an edge electrode or a center electrode or both, whether continuous or pulsed, may be applied only at selected times before or during a plasma process. For example, a DC bias may be applied only in an early phase of a plasma process, only during one step of a multi-step process, only occasionally to counteract erosion of features such as etch masks, only when erosion of features such as etch masks reaches a level of concern, in a periodic manner, or the like. Likewise, the DC biases may be modulated, for example, by changing the magnitudes of the biases, or changing the pulse widths and pulse frequencies for pulsed biases, or limiting the current supplied to electrodes, at selected times before or during a plasma process. Furthermore, a DC bias may be applied to an edge electrode or a center electrode while one or more RF biases are on or alternate with one or more RF biases. For example, one or more RF biases may be turned off, a DC pulse applied, said RF bias(es) turned on, and the sequence repeated.

As mentioned above, in some embodiments of upper electrode assemblies, there may be no central electrode. It is contemplated herein that in such cases, the upper electrode assembly may be annular in shape, with at least a portion of the inactive central portion absent.

In the embodiments disclosed above, an edge electrode supplied with a pulsed or continuous DC bias is used to generate an electron beam composed primarily of secondary electrons and direct it toward an extreme edge region of a substrate. In other embodiments, other electron sources, possibly external to key elements of a traditional plasma processing apparatus, may be employed to form the beam.

Figure 15:
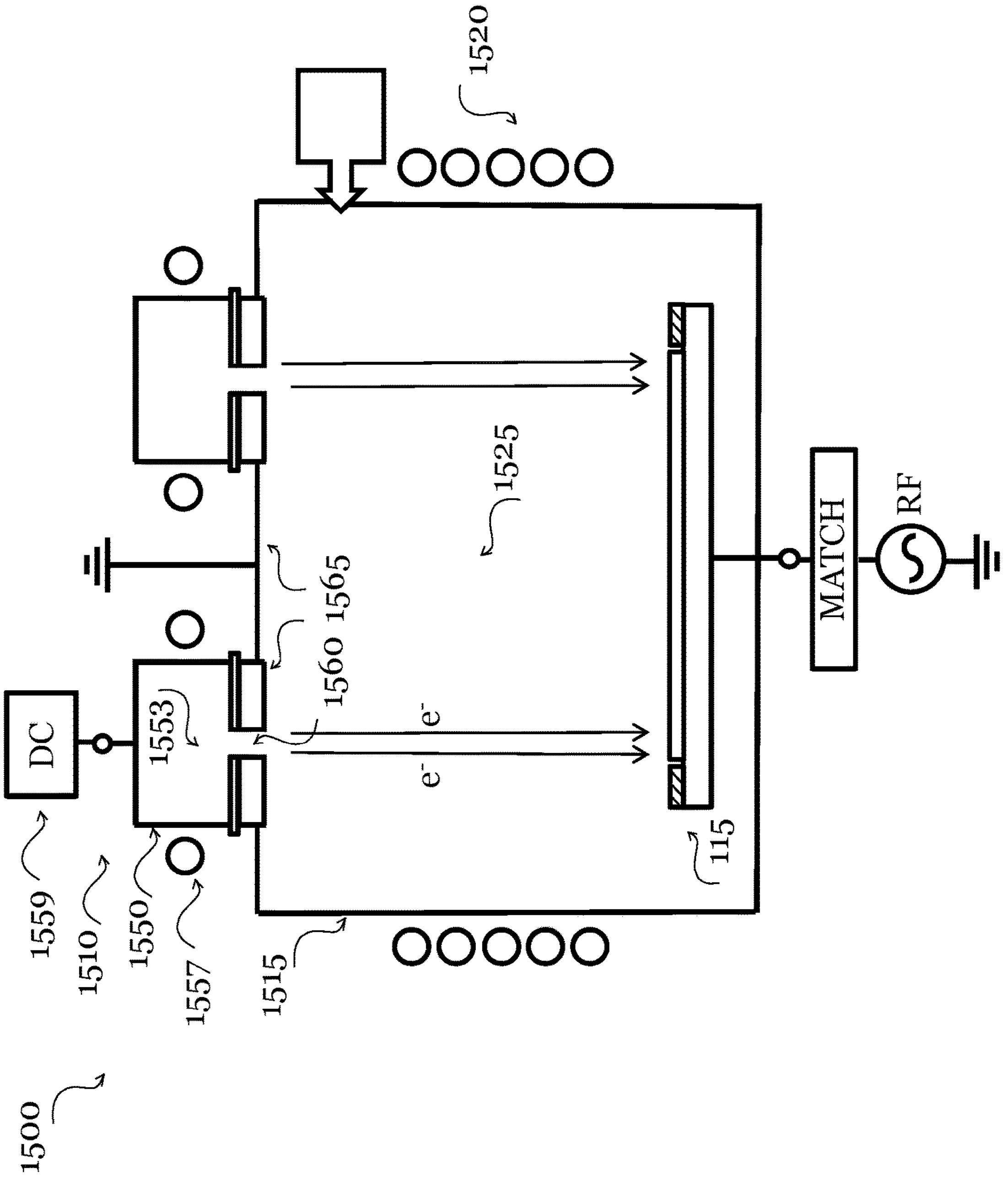
FIG. 15 is a schematic illustration of an embodiment of a plasma system comprising an electron source external to a primary plasma vacuum chamber.

FIG. 15 is a schematic illustration of an embodiment of a plasma system 1500 comprising an electron source 1510 external to a primary plasma chamber 1515 (e.g., a vacuum chamber).

In this embodiment, an RF bias is applied to a primary coil 1520, sustaining a plasma in a region 1525 of the primary chamber 1515 for plasma processing. In an embodiment, the electron source 1510 comprises a source chamber 1550, which may be an annular cylinder. An electron source plasma, distinct from the primary plasma, may be created in an interior region 1553 of the source chamber 1550 by a variety of techniques, including inductive coupling, electron-cyclotron resonance (ECR), hallow-cathode, and the like.

In the embodiment illustrated in FIG. 15, an RF supplied source coil 1557 sustains a source plasma in the region 1553. A DC supply 1559 provides a DC bias to some interior surfaces of the source chamber 1550. In various embodiments, the DC bias may be continuous or pulsed. In an embodiment, an outlet 1560 is grounded. Secondary electrons are generated by collisions of ions in the source plasma with the inside surfaces of the source chamber 1550, and are driven towards and through the outlet 1560 under the influence of the electric field between the DC-biased surfaces of the source chamber 1550 and the grounded outlet 1560. The outlet 1560 may be annular in shape, producing an electron beam of annular cross section. In various embodiments, surfaces 1565 facing the primary plasma are also grounded.

Example embodiments of the invention are summarized here. Other embodiments can also be understood from the entirety of the specification as well as the claims filed herein.

Example 1. A plasma processing system, including: a vacuum chamber; a substrate holder configured to hold a substrate to be processed and being disposed in the vacuum chamber; and an electron source disposed above a peripheral region of the substrate holder, the electron source being configured to generate an electron beam towards the peripheral region of the substrate holder.

Example 2. The system of example 1, where the electron source includes an edge electrode coupled to a direct current (DC) supply node.

Example 3. The system of example 2, where a ratio of an inside radius of the edge electrode to a width of the edge electrode varies between 10:1 to 150:1.

Example 4. The system of one of examples 2 to 3, where the edge electrode is covered by a dielectric material.

Example 5. The system of one of examples 2 to 4, further including a central electrode disposed above a central region of the substrate holder, the central electrode disposed within the edge electrode.

Example 6. The system of example 5, further including a gas inlet through the central electrode for providing a gas into the chamber.

Example 7. The system of one of examples 5 to 6, where the central electrode includes doped semiconductor material.

Example 8. The system of one of examples 1 to 7, where the system is configured to generate plasma within the vacuum chamber using an inductive process or a capacitive process.

Example 9. The system of one of examples 1 to 8, where the electron source includes an outlet configured to be coupled to an external source of electrons.

Example 10. A method of processing a semiconductor substrate using the system of claim 1, where the method includes placing the semiconductor substrate over the substrate holder; and processing the semiconductor substrate in the vacuum chamber.

Example 11. A method of processing including: placing a substrate to be processed on a substrate holder disposed within a vacuum chamber, the substrate including a central region surrounded by a peripheral region; and from an electron source, directing an electron beam including ballistic electrons towards the peripheral region.

Example 12. The method of example 11, where directing the electron beam includes applying a first direct-current pulse on an edge electrode disposed above the peripheral region.

Example 13. The method of one of examples 11 or 12, where the electron source includes an edge electrode disposed above the peripheral region and a central electrode disposed over the central region.

Example 14. The method of example 13, where directing the electron beam includes: applying a pulse sequence of direct current on the edge electrode, a high frequency bias on the center electrode, and a low frequency bias on the substrate holder; applying a first pulse sequence of direct current on the edge electrode, a high frequency bias and a second pulse sequence of direct current on the center electrode, and a low frequency bias on the substrate holder; applying a first pulse sequence of direct current on the edge electrode, a high frequency bias and a second pulse sequence of direct current on the center electrode, and a third pulse sequence of low frequency bias on the substrate holder; applying a first pulse sequence of direct current on the edge electrode, a reference potential on the center electrode, and a high frequency bias and a low frequency bias on the substrate holder; applying a first pulse sequence of direct current on the edge electrode, a second pulse sequence of direct current on the center electrode, and a high frequency bias and a low frequency bias on the substrate holder; applying a first pulse sequence of direct current on the edge electrode, a reference potential on the center electrode, and a high frequency bias and a pulsed low frequency bias on the substrate holder; or applying a pulse sequence of direct current on the edge electrode, a second pulse sequence of direct current on the center electrode, and a high frequency bias and a pulsed low frequency bias on the substrate holder.

Example 15. The method of example 13, where directing the electron beam includes: applying a pulse sequence of direct current on the edge electrode, a radio frequency bias on the center electrode, and a reference potential on the substrate holder; applying a radio frequency bias and a pulse sequence of direct current on the edge electrode, a radio frequency bias on the center electrode, and a reference potential on the substrate holder; or applying a pulse sequence of direct current on the edge electrode, a reference potential on the center electrode, and a radio frequency bias on the substrate holder.

Example 16. The method of one of examples 11 to 15, further including: generating plasma within a vacuum chamber; and directing ions from the plasma towards the substrate; and processing a surface of the substrate with the ions and the electron beam including the ballistic electrons.

Example 17. The method of example 16, where directing the electron beam and directing the ions are alternated.

Example 18. The method of example 16, where directing the electron beam and directing the ions is performed at the same time.

Example 19. An electron-generating apparatus of a plasma system, including: an edge electrode portion disposed around a central portion, the edge electrode portion including: an inner diameter greater than the diameter of the central portion, a thickness less than the inner diameter, a first conductive region disposed between the inner diameter and an outer diameter, a first electrical coupling component for coupling a direct-current (DC) power supply to the first conductive region, and an outer surface configured to be exposed to a plasma of the plasma system and configured to generate electrons.

Example 20. The apparatus of example 19, where the edge electrode portion is covered by a dielectric material.

Example 21. The apparatus of one of examples 19 or 20, further including: a central electrode portion disposed in the central portion, the central electrode portion including: a second conductive region distributed along or within the central electrode portion, a second electrical coupling component for a direct current (DC) source or an alternating current (AC) power source, the second electrical coupling component being coupled to the second conductive region, and a diameter that is larger than a thickness of the central electrode portion, where the second electrical coupling component is electrically isolated from the first electrical coupling component.

Example 22. The apparatus of example 21, where the second conductive region includes a doped semiconductor material.

Example 23. The apparatus of one of examples 21 to 22, where the central electrode portion includes a plurality of gas conduits, the plurality of gas conduits including a gas inlet on a surface of the central electrode portion and a gas outlet on an opposite surface.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, other embodiments of upper electrode assemblies discussed above, such as in FIGS. 5 and 6, may be fitted with gas conduits to be operable in the plasma system embodiment of FIG. 12. It is therefore intended that the appended claims encompass any such modifications or embodiments.

What is claimed is:

1. A method of processing comprising:

placing a substrate to be processed on a substrate holder disposed within a vacuum chamber, the substrate comprising a central region surrounded by a peripheral region, the substrate being in contact with a direct plasma generated in the vacuum chamber; and applying a direct current (DC) voltage to an annular electron source disposed above the substrate holder to generate an electron beam comprising ballistic electrons from the direct plasma in the vacuum chamber containing the substrate so that the electron beam impinges on the peripheral region and not on the central region of the substrate.

2. The method of claim 1, wherein directing the electron beam comprises applying a first direct-current pulse on an edge electrode disposed above the peripheral region.

3. The method of claim 1, wherein the annular electron source comprises an edge electrode disposed above the peripheral region and a center electrode disposed over the central region.

4. The method of claim 3, wherein directing the electron beam comprises:

applying a pulse sequence of direct current on the edge electrode, a high frequency bias on the center electrode, and a low frequency bias on the substrate holder;

applying a first pulse sequence of direct current on the edge electrode, a high frequency bias and a second pulse sequence of direct current on the center electrode, and a low frequency bias on the substrate holder;

applying a first pulse sequence of direct current on the edge electrode, a high frequency bias and a second pulse sequence of direct current on the center electrode, and a third pulse sequence of low frequency bias on the substrate holder;

applying a first pulse sequence of direct current on the edge electrode, a reference potential on the center electrode, and a high frequency bias and a low frequency bias on the substrate holder;

applying a first pulse sequence of direct current on the edge electrode, a second pulse sequence of direct current on the center electrode, and a high frequency bias and a low frequency bias on the substrate holder;

applying a first pulse sequence of direct current on the edge electrode, a reference potential on the center electrode, and a high frequency bias and a pulsed low frequency bias on the substrate holder; or applying a pulse sequence of direct current on the edge electrode, a second pulse sequence of direct current on the center electrode, and a high frequency bias and a pulsed low frequency bias on the substrate holder.

5. The method of claim 3, wherein directing the electron beam comprises:

applying a pulse sequence of direct current on the edge electrode, a radio frequency bias on the center electrode, and a reference potential on the substrate holder;

applying a radio frequency bias and a pulse sequence of direct current on the edge electrode, a radio frequency bias on the center electrode, and a reference potential on the substrate holder; or applying a pulse sequence of direct current on the edge electrode, a reference potential on the center electrode, and a radio frequency bias on the substrate holder.

6. The method of claim 1, further comprising:

generating the direct plasma within the vacuum chamber; and directing ions from the direct plasma towards the substrate; and processing a surface of the substrate with the ions and the electron beam comprising the ballistic electrons.

7. The method of claim 6, wherein directing the electron beam and directing the ions are alternated.

8. The method of claim 6, wherein directing the electron beam and directing the ions are performed at the same time.

9. A method of processing comprising:

generating an electron beam comprising ballistic electrons from a direct plasma generated in a vacuum chamber containing a substrate, the substrate comprising a surface to be processed comprising a central region surrounded by a peripheral region, the substrate being in contact with the direct plasma; and directing the electron beam towards the peripheral region so that the ballistic electrons impinge on the peripheral region and not on the central region of the substrate.

10. The method of claim 9, wherein the vacuum chamber is a direct plasma processing chamber, the method further comprising:

stimulating chemical reactions on the surface of the substrate using the ballistic electrons; and processing the surface of the substrate with ions from the direct plasma.

11. The method of claim 10, wherein stimulating the chemical reactions on the surface and processing the surface with the ions are performed at the same time.

12. The method of claim 10, wherein stimulating the chemical reactions on the surface and processing the surface with the ions are performed at different times.

13. The method of claim 9, wherein generating the electron beam comprises generating the electron beam using an exposed dielectric surface of an electron beam source disposed above the peripheral region of the substrate.

14. The method of claim 9, wherein directing the electron beam comprises applying a direct current pulse on an annular electrode disposed above the peripheral region.

15. The method of claim 14, wherein the annular electrode is an edge electrode of an electron beam source, and wherein generating the electron beam from the direct plasma comprises simultaneously applying a pulse sequence of direct current to the edge electrode, the edge electrode surrounding a center electrode of the electron beam source, and applying a radio frequency bias to the center electrode or a substrate holder supporting the substrate.

16. A method of processing comprising:

generating a direct plasma from a gas in a same plasma processing chamber as a substrate to be processed, the direct plasma being in contact with a surface of the substrate, the surface comprising a central region surrounded by a peripheral region;

generating an electron beam from the direct plasma that impinges on the peripheral region and not on the central region of the substrate using an electron beam source disposed above and vertically aligned with the peripheral region of the substrate, the electron beam comprising ballistic electrons traveling in a direction perpendicular to the peripheral region; and stimulating chemical reactions on the surface of the substrate using the ballistic electrons.

17. The method of claim 16, further comprising:

directing ions from the direct plasma towards the surface of the substrate; and processing the surface of the substrate with the ions.

18. The method of claim 16, wherein the electron beam source comprises an edge electrode surrounding a center electrode, the substrate is supported by a substrate holder, and generating the electron beam from the direct plasma comprises applying a first pulse sequence of direct current to the edge electrode and a radio frequency bias to the center electrode or the substrate holder.

19. The method of claim 18, wherein applying the first pulse sequence and the radio frequency bias further comprises:

applying a high frequency bias on the center electrode and a low frequency bias on the substrate holder;

applying a high frequency bias and a second pulse sequence of direct current on the center electrode, and a low frequency bias on the substrate holder;

applying a high frequency bias and a second pulse sequence of direct current on the center electrode, and a third pulse sequence of low frequency bias on the substrate holder;

applying a reference potential on the center electrode, and a high frequency bias and a low frequency bias on the substrate holder;

applying a second pulse sequence of direct current on the center electrode, and a high frequency bias and a low frequency bias on the substrate holder;

applying a reference potential on the center electrode, and a high frequency bias and a pulsed low frequency bias on the substrate holder; or applying a second pulse sequence of direct current on the center electrode, and a high frequency bias and a pulsed low frequency bias on the substrate holder.

20. The method of claim 18, wherein applying the first pulse sequence and the radio frequency bias further comprises:

applying a radio frequency bias on the center electrode, and a reference potential on the substrate holder;

applying a radio frequency bias on the edge electrode, a radio frequency bias on the center electrode, and a reference potential on the substrate holder; or applying a reference potential on the center electrode, and a radio frequency bias on the substrate holder.

* * * * *